United States Patent
Oguchi et al.

[19]

[11] Patent Number: 6,062,904
[45] Date of Patent: *May 16, 2000

[54] PC CARD CONNECTOR

[76] Inventors: Wataru Oguchi; Kazuki Satou; Hidehiro Nakamura, all of 1-7 Yukigaya, Otsuka-Cho, Ota-ku, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/951,856

[22] Filed: Oct. 16, 1997

[30] Foreign Application Priority Data

Oct. 17, 1996 [JP] Japan .................................. 8-274842

[51] Int. Cl.⁷ .................................................. H01R 13/60
[52] U.S. Cl. ........................ 439/541.5; 439/76.1; 439/607
[58] Field of Search ................................ 439/541.5, 76.1, 439/45, 607

[56] References Cited

U.S. PATENT DOCUMENTS

| | | | |
|---|---|---|---|
| 5,023,752 | 6/1991 | Detter et al. | 439/76.2 |
| 5,165,055 | 11/1992 | Metsler | 361/818 |
| 5,390,081 | 2/1995 | St. Pierre | 439/45 |
| 5,470,259 | 11/1995 | Kaufman et al. | 439/607 |
| 5,587,890 | 12/1996 | Happ et al. | 361/826 |
| 5,679,008 | 10/1997 | Takahashi et al. | 439/76.1 |
| 5,711,679 | 1/1998 | Spickler et al. | 439/541.5 |
| 5,775,923 | 7/1998 | Tomioka | 439/541.5 |

*Primary Examiner*—Renee S. Luebke
*Assistant Examiner*—T C Patel
*Attorney, Agent, or Firm*—Brinks Hofer Gilson & Lione

[57] ABSTRACT

Disclosed is a PC card connector wherein since only one board is used, the number of steps necessary for carrying out, e.g., soldering on the board in the assembly process is cut down, the production cost is reduced, and the time required for the assembly work is shortened, wherein since a conversion connector is required to have a space for insertion of only one board, the connector itself and a unit receiving the connector are reduced in both size and weight, and wherein since an inner layer of the board serves as a specific ground layer, a sufficient grounding effect is achieved. The PC card connector comprises a single board provided with two sets of connector pins to which two PC cards are stuck and plugged, and a conversion connector to which the board is attached. The board is constructed of a multilayered board such that a signal pattern is formed on each of surface layers on both the surface sides or an inner layer on the inner side, and a ground pattern is formed on the inner layer or each of the surface layers.

11 Claims, 11 Drawing Sheets

PC CARD CONNECTOR

BACKGROUND OF THE INVENTION

1. Field of the Invention

The present invention relates to a PC card connector mounted on an apparatus into which are inserted two PC cards in use, and more particularly to a PC card connector including a number of pin contacts inserted and soldered to a board.

2. Description of the Related Art

Heretofore, there is known a PC card connector of the type fitting two PC cards to one connector.

Such a PC card connector primarily comprises, as shown in FIG. 14, a first group of pins 1 to which one PC card (not shown) is stuck and plugged in the direction of arrow, a first board 3 having insertion holes 2 into which the first group of pins 1 are inserted and fixedly soldered, a second group of pins 4 to which the other PC card (not shown) is stuck and plugged in the direction of arrow, a second board 6 having insertion holes 5 into which the second group of pins 4 are inserted and fixedly soldered, and a conversion connector 8 having grooves 7 into which lower edges of the first board 3 and the second board 6 are fitted and fixedly soldered.

Denoted by 9 is a shroud (metal plate) held in contact with a case of the PC card for grounding (earthing). Two shrouds 9 are disposed respectively along upper edges of the first and second boards 3, 6 and connected to ground patterns on the boards 3, 6. The first and second boards 3, 6 are each a two-layer board with the ground pattern and a signal pattern formed in respective layers.

Further, the first and second boards 3, 6 are arranged side by side in vertical posture, as viewed on the drawing, and the two PC cards are inserted in the horizontal direction. Accordingly, the second board 6 is formed to have a shorter vertical length than the first board 3 such that the first and second groups of pins 1, 4 are both exposed leftward.

In the above conventional PC card connector, however, the use of two bards necessarily results in that the pins 1, 4 and the shrouds 9 must be soldered to the boards 3, 6 as at least two separate steps in the process of assembling the PC card connector. In other words, because soldering cannot be performed on the two boards 3, 6 at a time, the conventional PC card connector requires a larger number of assembly steps.

Also, because the conversion connector 8 must receive the two boards 3, 6, it has a difficulty in manufacture.

Further, because of using the two boards 3, 6, a gap is required to be left between both the boards 3 and 6, which increases the entire size of the connector.

Additionally, although back surfaces of the boards 3, 6 are entirely used as ground surfaces, the areas of the boards 3, 6, in particular, the area of one board 6, is too small to achieve a sufficient grounding effect.

SUMMARY OF THE INVENTION

A first object of the present invention is to provide a PC card connector wherein since only one board is used, the number of steps necessary for carrying out, e.g., soldering on the board in the assembly process is cut down, the production cost is reduced, and the time required for the assembly work is shortened, wherein since a conversion connector is required to have a space for insertion of only one board, the connector itself and a unit receiving the connector are reduced in both size and weight, and wherein since an inner layer of the board serves as a specific ground layer, a sufficient grounding effect is achieved.

A second object of the present invention is to provide a PC card connector wherein since two inner layers serve as ground layers, impedance is kept small, a rise in potential is suppressed, and conductivity efficiency is improved.

A third object of the present invention is to provide a PC card connector wherein since an inner layer serves as a ground layer common to both surface layers, matching between both the surface layers is established with low impedance, a rise in potential is suppressed, and conductivity efficiency is improved.

A fourth object of the present invention is to provide a PC card connector wherein a transmission characteristic is improved.

A fifth object of the present invention is to provide a PC card connector wherein since the distance between lines of a signal pattern of the surface layer on each of both the surface sides is substantially equal to the distance between the surface layer and the inner layer, impedance becomes equal, a potential difference is reduced, and conductivity efficiency is improved.

To achieve the first object, a PC card connector according to a first aspect of the present invention comprises a single board provided with two sets of connector pins to which two PC cards are stuck and plugged, and a conversion connector to which the board is attached, the board being constructed of a multilayered board such that a signal pattern is formed on each of surface layers on both the surface sides or an inner layer on the inner side, and a ground pattern is formed on the inner layer or each of the surface layers.

According to a second aspect of the present invention, the second object is achieved with the above PC card connector according to the first aspect wherein four layers having the patterns are formed on the board and two inner layers of the four layers serve as ground patterns.

According to a third aspect of the present invention, the third object is achieve with the above PC card connector according to the first aspect wherein three layers having the patterns are formed on the board and one inner layer of the three layers serves as a ground pattern common to the signal patterns of the surfaces layers on both the surface sides.

According to a fourth aspect of the present invention, the fourth object is achieved with any of the above PC card connectors according to the first to third aspects wherein the layer of the board including the signal pattern formed thereon and locating on the side opposite to the soldered surface is formed such that lands are partly made small or eliminated to increase a width of each pattern line extending between the lands and a distance between the patterns lines.

According to a fifth aspect of the present invention, the fifth object is achieved with any of the above PC card connectors according to the first to third aspects wherein the distance between lines of the signal pattern of the surface layer on each of both the surface sides is substantially equal to the distance between the surface layer and the inner layer.

DESCRIPTION OF THE PREFERRED EMBODIMENTS

Preferred embodiments of the present invention will be described hereunder with reference to the drawings.

Initially, a first embodiment of the present invention will be described with reference to FIGS. 1 to 6 of the drawings.

Figure 1:
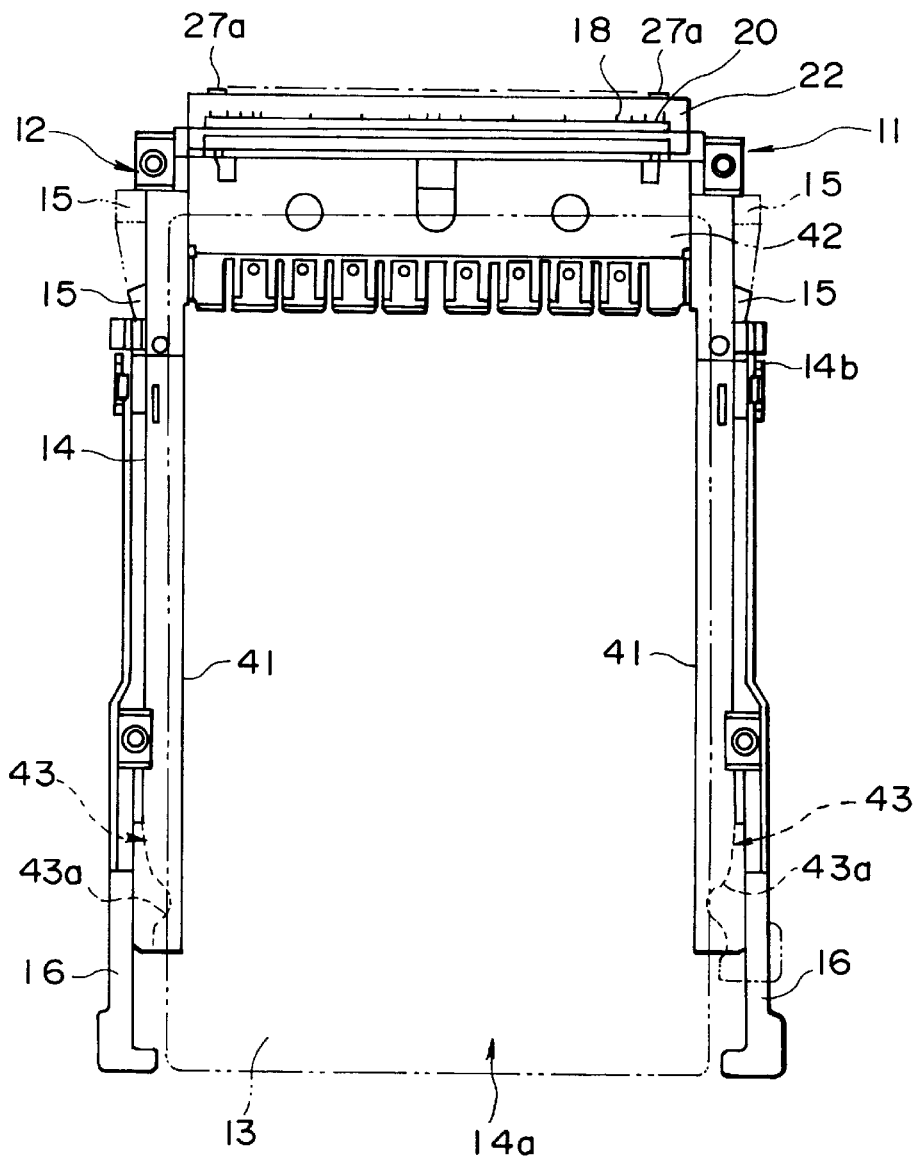
FIG. 1 is an overall plan view of a PC card connector according to a first embodiment of the present invention.
Figure 2:
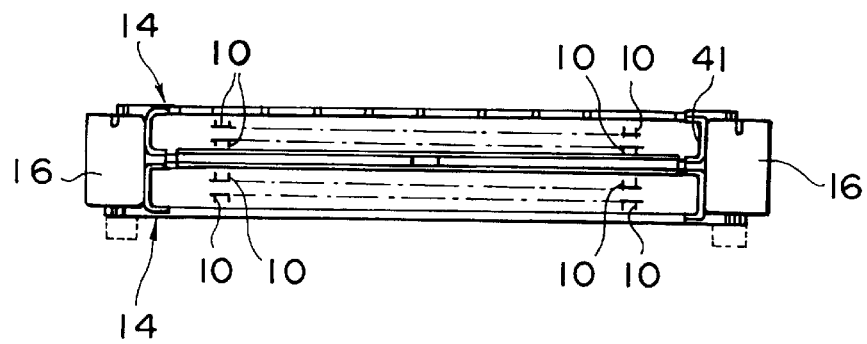
FIG. 2 is an overall side view of the connector.
Figure 3:
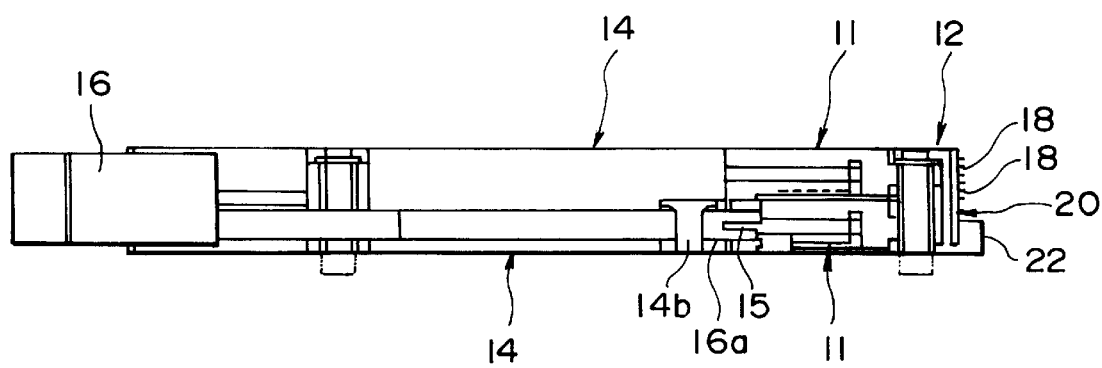
FIG. 3 is an overall front view of the connector.
Figure 4:
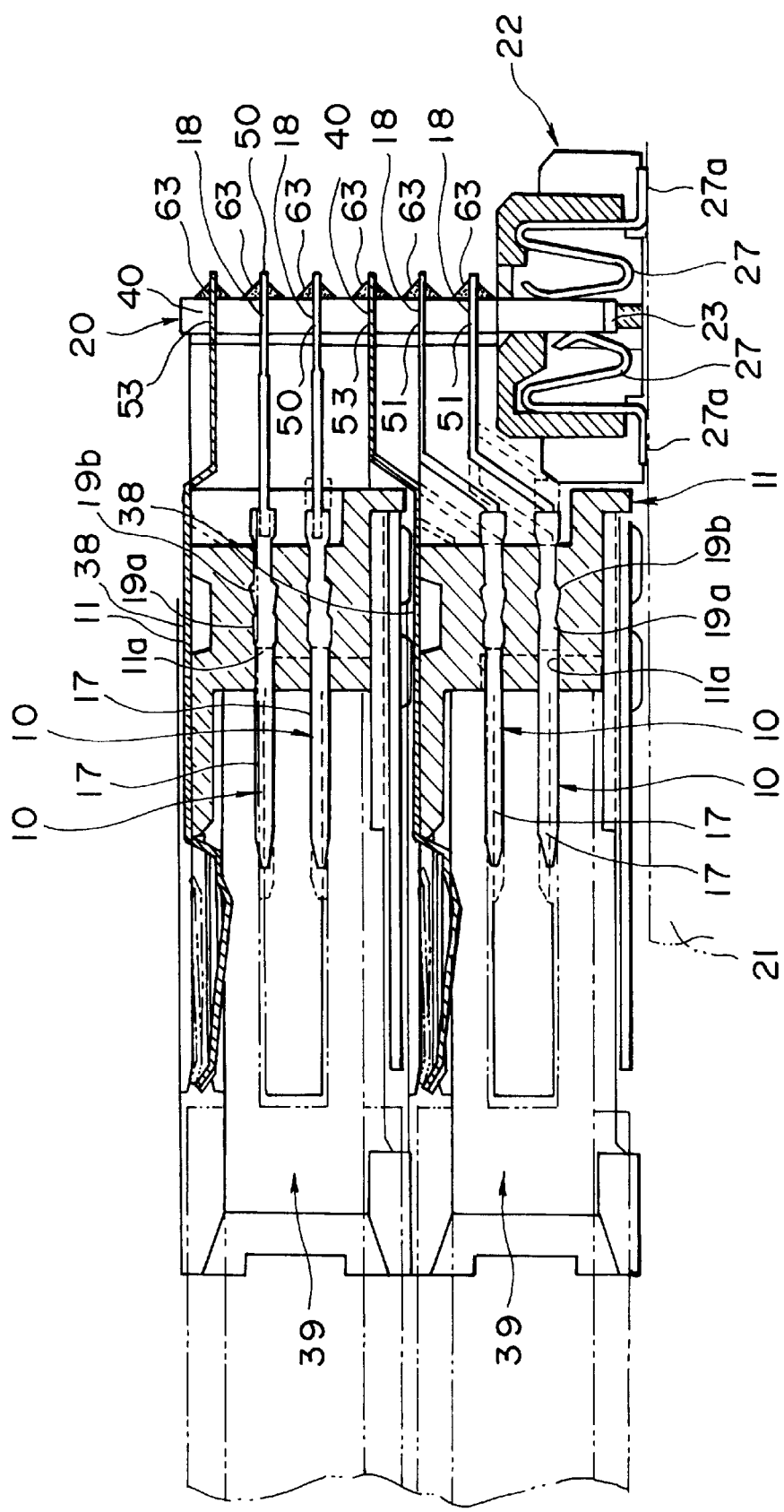
FIG. 4 is a vertical sectional view of principal part of the connector.

FIG. 1 is an overall plan view of a PC card connector according to the first embodiment of the present invention, FIG. 2 is an overall side view of the connector, FIG. 3 is an overall front view of the connector, FIG. 4 is a vertical sectional view of principal part of the connector, and FIGS. 5 and 6 are sets of plan views of various patterns formed on a board of the connector.

The PC card connector shown in those drawings is primarily made up of a header 12 including a number of pin contacts 10 fixedly press-fitted to a housing 11 in a predetermined array, two frames 14 being substantially U-shaped to guide PC cards 13 when the cards are inserted and pulled out, and an eject lever 15 and a push rod 16 associated with each of the frames 14 to serve as an eject mechanism.

The pin contacts 10 are each configured to have a contact portion 17 being substantially in a columnar shape at one end and a terminal portion 18 at the other end. On part of the contact portion 17 nearer to the terminal portion 18, the pin contact 10 also has a bulged portion 19a and a lock portion 19b which are fitted to and locked in a pin insertion hole 11a of the pin housing 11 to prevent the pin contact from slipping off.

Components of the header 12, except the pin contacts 10, will be described below in detail.

The header 12 is primarily made up of two pin housings 11, 11 including two sets of contact pins 10 in a predetermined number fixedly press-fitted thereto. More specifically, one set of contact pins 10 are fixedly press-fitted to each of the two pin housings 11 which are placed one above the other in two stages. The terminal portions 18 of the pin contacts 10 are fixedly soldered to a signal pattern on a board 20. The header 12 is placed on a mount surface of a main printed board 21, and a lower edge of the board 20 is fitted and soldered to a fitting groove 23 of a conversion connector 22 mounted on the main printed board 21. Pairs of connecting springs 27, 27 are installed in the conversion connector 22 to hold the board 20 therebetween such that one ends of the springs come into pressure contact with connecting pads 24, 25 on both sides of the board 20. The other ends 27a of the pairs of connecting springs 27, 27 are led out of the conversion connector 22 and soldered to a circuit pattern on the main printed board 21.

Denoted by 38 is a shroud (metal plate) held at one end in contact with a case of the PC card 13 through an opening 39 of the pin housing 11 for grounding (earthing). The shroud 38 has terminal portions 40, 40, ... which are formed at the other end on the side of the board 20 and connected to a ground pattern on the board 20.

Also, in front and bottom surfaces of each pin housing, there are formed a number of parallel guide grooves (not shown) into which the terminal portions 18 of the many pin contacts 10 can be inserted for positioning. Additionally, both the pin housings 11, 11 are joined into a one-piece structure by mutual fitting hole formed in one of the pin housing and a projection provided on the other.

The frames 14 of the PC card connector of the surface mount type according to this embodiment and the eject mechanism (the eject lever 15 and the push rod 16) will be continuedly described in detail.

In the PC card connector, the two frames 14, 14 (see FIG. 1) being substantially U-shaped are fixedly placed one above the other in two stages. The upper frame 14 is fitted at its rear end portion to side walls of the pin housing 11 in the upper stage, and the lower frame 14 is likewise fitted at its rear end portion to side walls of the pin housing 11 in the lower stage. Each of the frames 14 has a pair of recess forming portions 41 extending in the longitudinal direction to guide the PC card 13 when it is inserted and pulled out, and to define a card insertion port 14a at its front end, and a bridging portion 42 for coupling the rear end portions of the recess forming portions 41 to each other. When the frame 14 is fitted to the side walls of the pin housing 11, the pin contacts 10 fixedly press-fitted to the pin housing 11 are positioned to locate in the card insertion port 14a. Also, a circular boss (not shown) is projected midway the bridging portion 42 of each frame 14 and is inserted into a shaft hole formed midway the eject lever 15 so that the eject lever 14 is pivotally supported by the frame 14 with the circular boss (not shown) serving as a pivot shaft. Further, a rod support frame 14b projects outward from one of the recess forming portions 41 of each frame 14 to support the push rod 16 in such a manner as able to move forth and back in the longitudinal direction. One end of the eject lever 15 is then engaged with a bifurcated portion 16a at a rear end of the push rod 16 so that a card contacting piece 15c at the other end of the eject lever 15 can move forth and back to some extent in the longitudinal direction at a corner of the header 12 with pivot movement of the eject lever 15.

Stated otherwise; when the PC card 13 is inserted into one of the upper and lower frames 14 of the PC card connector through the card insertion port 14a and enters the header 12 at the rear end, the card contacting piece (not shown) of the eject lever 15 is pushed by the PC card to retract. Just after the push rod 16 is moved forward correspondingly, socket contacts in the PC card 13 are connected to the pin contacts 10 to complete insertion of the PC card 13. When pulling out the PC card 13 in the inserted state, the corresponding push rod 16 is pushed rearward, whereupon the end of the eject lever 15 projecting out of the frame 14 is pivoted to move upward, as viewed on FIG. 1, causing the card contacting piece (not shown) to move forward. The PC card 13 is thereby pushed by the card contacting piece (not shown) to dislodge from the pin contacts 10, allowing an operator to readily pull the PC card 13 out of the card insertion port 14a with the fingers.

As described above, this embodiment provides a PC card connector adapted for two cards which includes, for each of the upper and lower stages, the pin housing 11 provided with the pin contacts 10 fixed thereto in the predetermined array, the frame 14 having the card insertion port 14a at the front end and fitted at the rear end portion to the pin housing 11, and the eject lever 15 and the push rod 16 both supported by the frame 14, so that the PC card 13 can be inserted in any of the upper and lower stages.

The upper and lower frames 14 are coupled to each other at total four locations, i.e., two locations on each of the front and rear sides. Of these four locations, at the right and left locations on the front side, there are employed ground metals 43 serving as not only joint metals but also ground terminals. The ground metals 43 has a pair of curved resilient pieces 43c extending forward from there and positioned to be able to come into resilient contact with surfaces of the PC cards 13 inserted in the upper and lower frames 14, and bottom plates (not shown) positioned to be able to come into pressure contact with a ground circuit (not shown) of the main printed board 21 when the connector is mounted on the board 21.

A description will now be made of the board 20 to which are connected the terminal portions 18 of the pin contacts 10 and the terminal portions 40 of the shroud 38, as stated above.

The board 20 is formed by superposing a first-layer resist 44, a first-layer pattern 45, a second-layer ground pattern 46, a third-layer ground pattern 47, a fourth-layer pattern 48 and a fourth-layer resist 49, as shown in FIGS. 5 and 6. The first-layer pattern 45, the second-layer ground pattern 46, the third-layer ground pattern 47 and the fourth-layer pattern 48 are formed by coating copper foils on respective bases B, B, . . . of synthetic resin. The bases B, B, . . . having the patterns 45 to 48 formed thereon are superposed with insulating layers of synthetic resin place between adjacent two of the bases. Further, the first-layer resist 44 and the fourth-layer resist 49 are formed on both sides of the board 20, respectively, thereby constructing a single multilayered board as a whole.

In the board 20, there are bored two rows of many insertion holes 50 into which are inserted the terminal portions 18, 18, . . . of the pin contacts 10 in the upper stage, respectively, and two rows of many insertion holes 51 into which are inserted the terminal portions 18, 18, . . . of the pin contacts 10 in the lower stage, respectively. Also, at both side ends of the board 20, there are formed cutouts 52, 52, . . . to which are fitted projections (not shown) on the pin housing 11. Denoted by 53 are insertion holes into which are inserted the terminal portions 40 of the shroud 38, and denoted by 54 are through holes for connection to lands 100 of a ground (earth) pattern 57 (described later) of the first-layer pattern 45 and respective ground (earth) patterns (described later) of the fourth-layer pattern 48, the second-layer ground pattern 46 and the third-layer ground pattern 47. Incidentally, the insertion holes 50, 51 are through holes.

The first-layer pattern 45 is a pattern constituted by copper foils formed on its base B. As shown in FIG. 5, lands 55 are formed around the respective insertion holes 51, and the terminal portions 18 of the pin contacts 10 in the lower stage are fixedly soldered to the lands 55 for connection therebetween. The lands 55 are connected by routing patterns to connecting pads 24, 24, . . . formed to lie in a row along a lower edge of the board 20.

Denoted by 57 is a ground pattern formed on the first-layer pattern 45. The ground pattern 57 is formed around those ones of the insertion holes 50, 51 which locate at both ends, and are soldered to those ones of the terminal portions 18 of the pin contacts 10 in the upper and lower stages which locate at both ends for grounding. The ground pattern 57 is also formed around the insertion holes 53 and soldered to the terminal portions 40 of the shroud 38. In addition, the ground pattern 57 is connected to the through holes 54 for connection to the ground patterns of the various layers. Denoted by 24a are connecting pads of the ground pattern 57, with which the connecting springs 27 come into pressure contact.

Denoted by 58 are lands formed respectively around the insertion holes 50. The lands 58 are connected to lands 60 (described later) of the fourth-layer pattern 48 via through holes formed by the insertion holes 50.

Figure 5A:
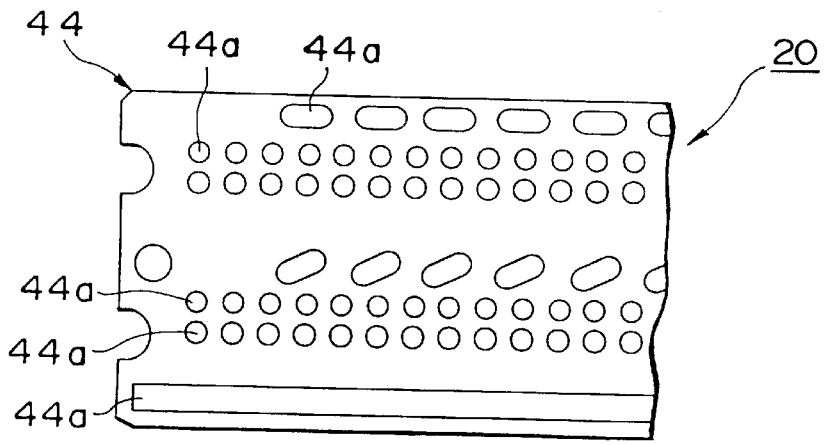
FIGS. 5A–C are a set of plan views of various patterns formed on a board of the connector.
Figure 5B:
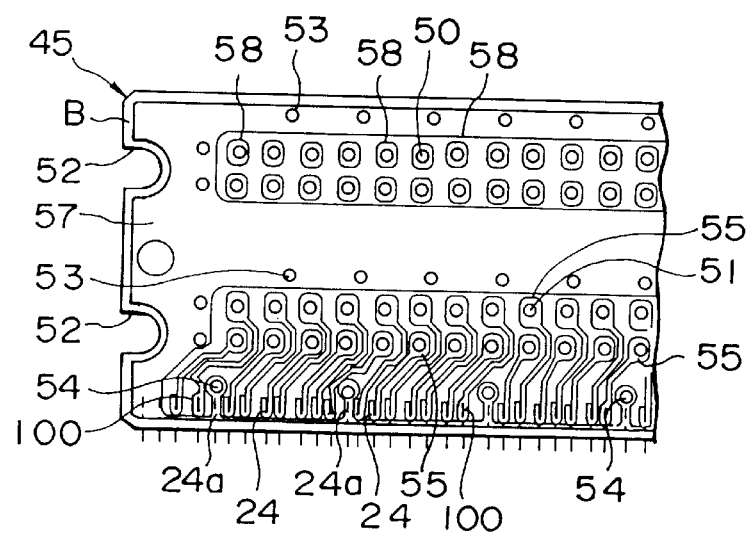

The first-layer resist 44 is superposed on a surface (one side) of the first-layer pattern 45. As shown in FIGS. 5A and 5B, the first-layer resist 44 has openings 44a, 44a, . . . where the lands 55, 58, the connecting pads 24, 24a, the insertion holes 53, etc. are to be exposed.

Figure 5C:
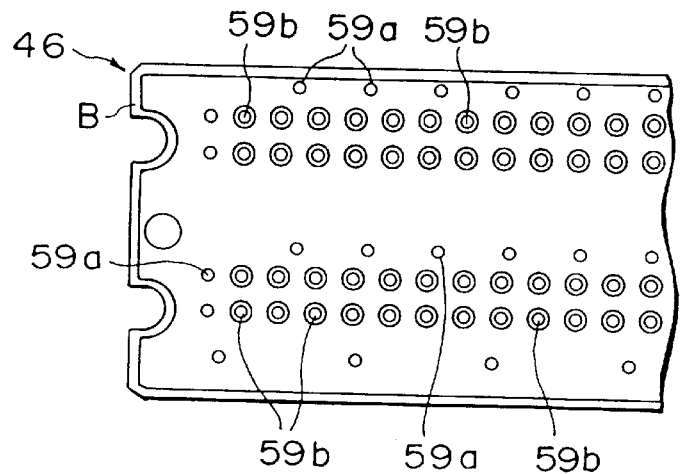

The second-layer ground (earth) pattern 46 (also the third-layer ground pattern 47 shown in FIG. 6A) is constituted by copper foils formed on its base B. As shown in FIG. 5C, the second-layer ground pattern 46 has a number of holes 59a, 59b formed corresponding to the insertion holes 50, 51, 53 through which are inserted the terminal portions 18 of the pin contacts 10 and the terminal portions 40 of the shrouds 38. Of these holes 59a, 59b, the holes 59a corresponding to the insertion holes 53 and the insertion holes 50, 51 through which are inserted the grounding terminal portions 18 at both the ends are connected to the ground patterns of the various layers by through holes. Inner peripheries of the holes 59b are defined to be apart from the insertion holes 50, 51 for disconnection therebetween.

Figure 6A:
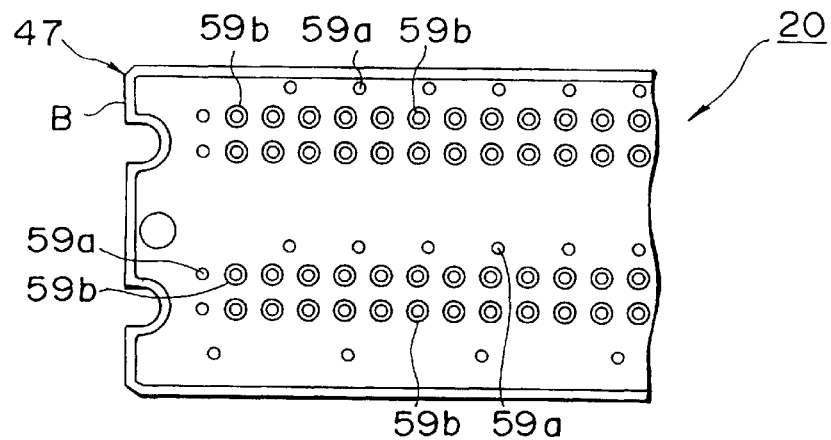
FIGS. 6A–C are a set of plan views of various patterns formed on the board of the connector.
Figure 6B:
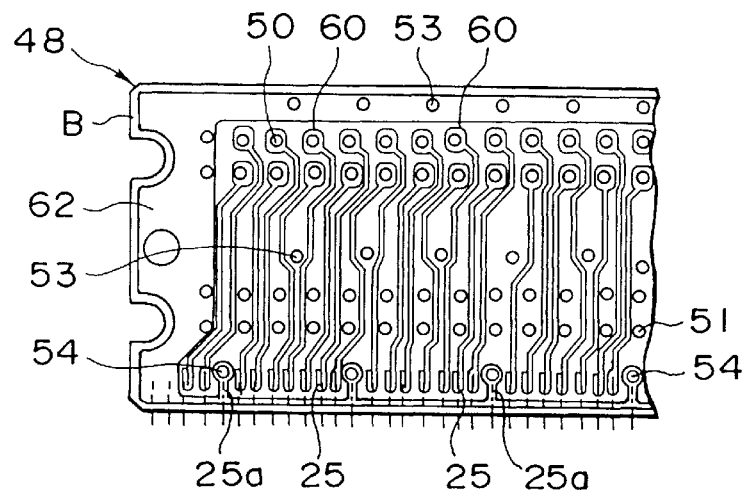

The fourth-layer pattern 48 is a pattern constituted by copper foils formed on its base B. As shown in FIG. 6B, lands 60 are formed around the respective insertion holes 50. The lands 60 are connected by routing patterns to connecting pads 25 formed to lie in a row along a lower edge of the board 20. Further, the lands 60 are connected to the lands 58 of the first-layer pattern 45 via the through holes formed by the insertion holes 50. Denoted by 62 is a ground pattern formed in the fourth-layer pattern 48 as with the first-layer pattern 45. Denoted by 25a are connecting pads of the ground pattern 62, with which the connecting springs 27 come into pressure contact.

Note that, in the fourth-layer pattern 48, no lands are formed around the insertion holes 51; hence the connecting pads 25 of the fourth-layer pattern 48 are not connected to the terminal portions 18 of the pin contacts 10 in the lower stage (except the grounding terminal portions 18 at both the ends).

Figure 6C:
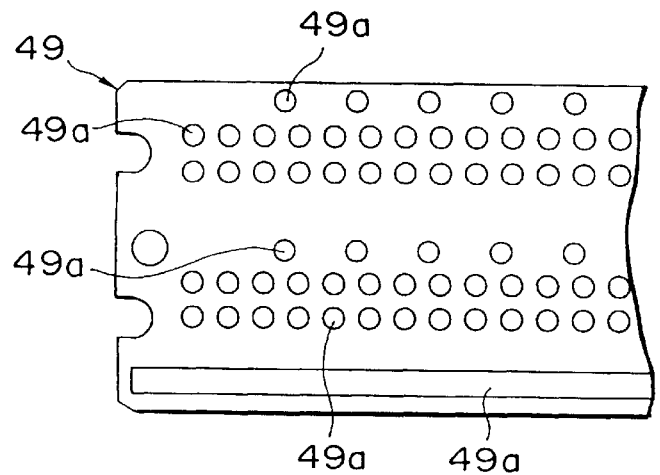

The fourth-layer resist 49 is superposed on a surface (one side) of the fourth-layer pattern 48 (on the rear side relative to the first-layer pattern 45). As shown in FIG. 6C, the fourth-layer resist 49 has openings 49a where the lands 60, the connecting pads 25, 25a, the insertion holes 51, 53, etc. are to be exposed.

The multilayered board 20 is formed by superposing the above-mentioned layers. From the side of the fourth-layer pattern 48 of the board 20 (i.e., from the left side), as shown in FIG. 4, the terminal portions 18 of the pin contacts 10 in the upper stage are inserted through the insertion holes 50, the terminal portions 18 of the pin contacts 10 in the lower stage are inserted through the insertion holes 51, and the terminal portions 40 of the shrouds 38 are inserted through the insertion holes 53, respectively, such that tips of those terminal portions are projected from the side of the first-layer pattern 45. After that, soldering is applied to the board 20 on the side of the first-layer pattern 45 (i.e., on the right side in FIG. 4) for fixedly connecting the terminal portions 18 of the pin contacts 10 in the upper stage to the lands 58 of the first-layer pattern 45, the terminal portions 18 of the pin contacts 10 in the lower stage to the lands 55 thereof, and the terminal portions 40 of the shrouds 38 to the lands of the ground pattern 57 around the insertion holes 53 by solders 63. Also, the grounding terminal portions 18 of the pin contacts 10 in the upper and lower stages are connected to the lands of the ground pattern 57 around the insertion holes 50, 51 by solders 63.

Accordingly, by fitting the lower edge of the board 20 to the fitting groove 23 of the conversion connector 22 as shown in FIG. 4, the terminal portions 18 of the pin contacts 10 in the lower stage are connected to the circuit pattern (not shown) on the main printed board 21 via the lands 55 of the first-layer pattern 45, the connecting pads 24, 24a, and the connecting springs 27 on the right side of the conversion connector 22. Also, the terminal portions 18 of the pin contacts 10 in the upper stage are connected to the circuit pattern (not shown) on the main printed board 21 via the lands 58 of the first-layer pattern 45, the lands 60 of the fourth-layer pattern 48 which are electrically connected to the lands 58 via the through holes formed by the insertion holes 50, the connecting pads 25, 25a, and the connecting springs 27 on the left side of the conversion connector 22. Further, since the through holes formed by the insertion holes 50, 51 are connected to the second-layer ground pattern 46 and the third-layer ground pattern 47, the terminal portions 18 of the pin contacts 10 in the upper and lower stages are connected to the second-layer ground pattern 46 and the third-layer ground pattern 47 by those through holes.

The PC card connector of the first embodiment stated above includes one substrate 20 having two sets of connector pins to which the two PC cards 13 are stuck and plugged, and the conversion connector 22 to which the board 20 is fitted. The board 20 is constructed of a multilayered board such that the first- and fourth-layer patterns 45, 48 for transmitting signals are formed on surface layers on both the surface sides or inner layers on the inner side, and the second- and third-layer ground patterns 46, 47 are formed on the inner layers or the surface layers. Thus, since only one board 20 is used, the number of steps necessary for carrying out, e.g., soldering on the board 20 in the assembly process can be cut down, the production cost can be reduced, and the time required for the assembly work can be shortened. Also, since the conversion connector is required to have a space for insertion of only one board 20, the connector itself and a unit receiving the connector can be reduced in both size and weight. Further, since the inner layers of the board serve as specific ground layers, a sufficient grounding effect can be achieved.

Also, with the first embodiment, four layers having patterns are formed on the board 20 and two inner layers of these four layers serve as the ground layers 46, 47. Accordingly, impedance can be kept small, a rise in potential can be suppressed, and conductivity efficiency is improved.

Further, with the first embodiment, of the signal patterns 45, 48, the fourth-layer pattern 48 on the side opposite to the soldered surface is formed such that lands are partly made small or eliminated to increase a width of each pattern line extending between the insertion holes 51 and a distance between the patterns lines. As a result, a transmission characteristic is improved.

In addition, with the first embodiment, the distance between lines of the signal pattern of the surface layer on each of the surface sides is substantially equal to the distance between the surface layer and the inner layer. Accordingly, impedance becomes equal, a potential difference can be diminished, and conductivity efficiency can be improved.

While the first embodiment has been explained in connection with the 4-layered board including the second-layer ground pattern 46 and the third-layer ground pattern 47, the present invention is not limited to the first embodiment. For example, the board may be practiced as a 3-layer board by omitting one of the second-layer ground pattern 46 and the third-layer ground pattern 47.

In the embodiment using such a 3-layer substrate, three layers having patterns are formed on the board 20 and one inner layer of the three layers on the inner side serves as a ground pattern common to signal patterns of two surface layers on both surface sides. With the inner layer grounding both the surface layers in common, a rise in potential is suppressed, if so, and conductivity efficiency is improved.

Also, while the two inner layers of the four layers serve as ground patterns in the first embodiment, the ground patterns may be formed in three, four or more layers.

Figure 7:
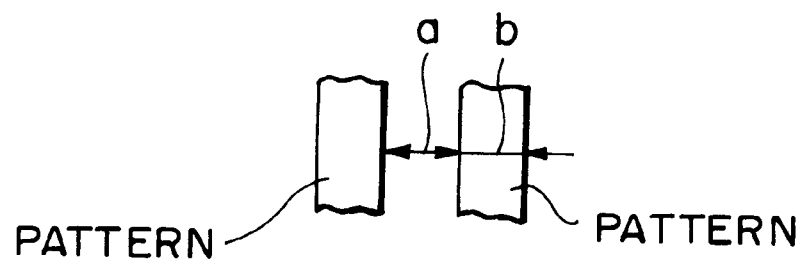
FIG. 7 is an explanatory view showing the relation between a pattern width and a pattern-to-pattern distance.

The patterns may be formed, as shown in FIG. 7, such that the pattern width b is not less than 0.1 mm and the pattern-to-pattern distance a is not less than 0.1 mm. This dimensional setting improves a transmission characteristic and hence performance of the connector.

Figure 8:
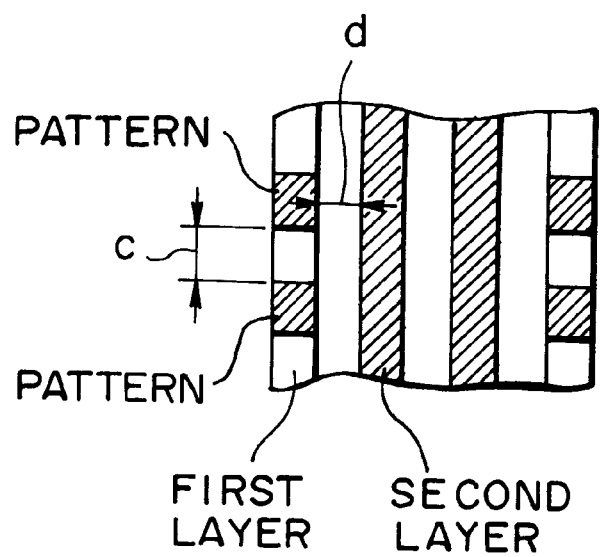
FIG. 8 is an explanatory view showing the relation between the pattern-to-pattern distance and a layer-to-layer distance.

Further, the patterns may be formed, as shown in FIG. 8, such that the pattern-to-pattern distance c of the first layer is substantially equal to the distance d between the first and second layers. This dimensional setting makes impedance equal and reduces a potential difference.

A second embodiment of the present invention will be described below.

FIGS. 9A–9C and 10A–10C are sets of plan views of various patterns for use in a second embodiment of the present invention.

Since the second embodiment differs from the first embodiment only in construction of a board, the following description will be made of the board. The remaining components are the same as in the first embodiment.

The two inner layers of the four layers serve as ground patterns in the first embodiment, whereas a board 20A in the second embodiment is formed to have ground patterns located on both surface sides and signal patterns located on the inner side. Note that the same components as those in the first embodiment are denoted by the same numerals and will not be described below in detail.

In the second embodiment, the board 20A is formed by superposing a first-layer resist 86, a first-layer ground pattern 64, a second-layer pattern 72, a third-layer pattern 79, a fourth-layer ground pattern 88 and a fourth-layer resist 87, as shown in FIGS. 9A–9C and 10A–C. The first-layer ground pattern 64, the second-layer pattern 72, the third-layer pattern 79 and the fourth-layer ground pattern 88 are formed by coating copper foils on respective bases B, B, . . . of synthetic resin. The bases B, B, . . . having the patterns 64, 72, 79, 88 formed thereon are superposed with insulating layers of synthetic resin placed between adjacent two of the bases. Further, the first-layer resist 86 and the fourth-layer resist 87 are formed on both sides of the board 20A, respectively, thereby constructing a single multilayered board as a whole.

In the board 20A, there are bored two rows of many insertion holes 50 into which are inserted the terminal portions 18 of the pin contacts 10 in the upper stage, respectively, and two rows of many insertion holes 51 into which are inserted the terminal portions 18, of the pin contacts 10 in the lower stage, respectively. Denoted by 53 are insertion holes into which are inserted the terminal portions 40 of the shroud 38.

Figure 9A:
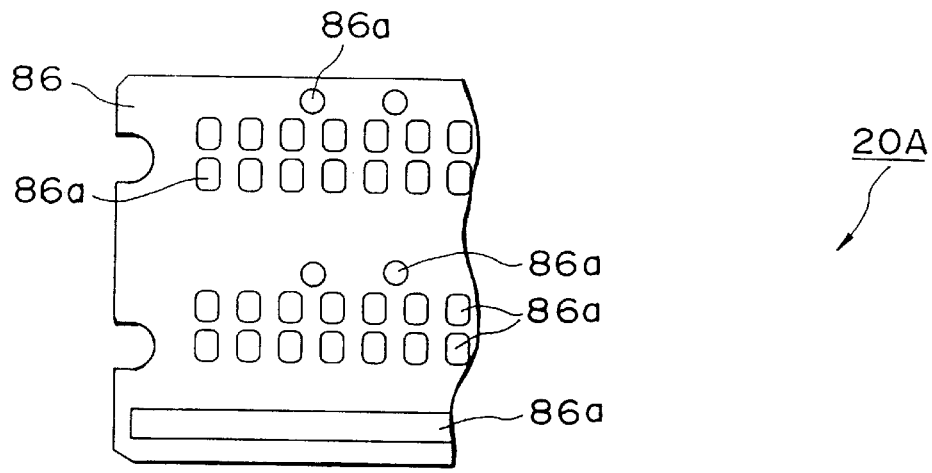
FIGS. 9A–C are a set of plan views of various patterns formed on a board of a PC card connector according to a second embodiment of the present invention.
Figure 9B:
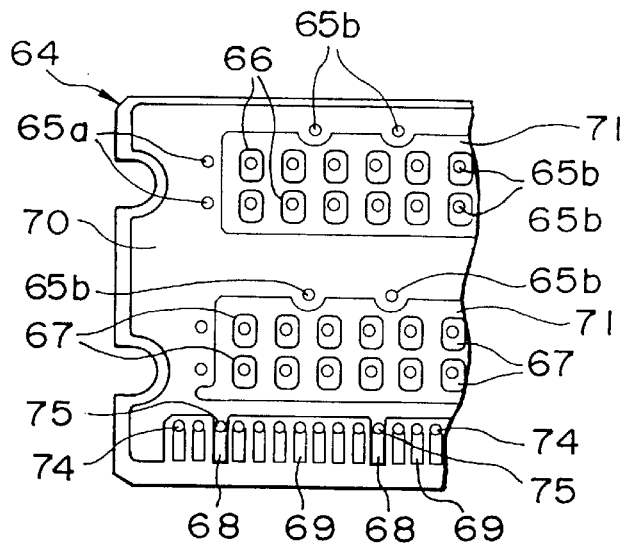

The first-layer ground pattern 64 (also the fourth-layer ground pattern 88) is constituted by copper foils formed on its base B. As shown in FIG. 9B, the first-layer ground pattern 64 has a number of insertion holes 65b, 65b, . . . formed corresponding to the insertion holes 50, 51 through which are inserted the terminal portions 18 of the pin contacts 10 and the insertion holes 53 through which are inserted the terminal portions 40 of the shrouds 38. Lands 66 are formed along peripheral edges of the insertion holes 50 (65b), and are electrically connected to lands 80 of the third-layer pattern 79 and lands 66 of the fourth-layer ground pattern 88, described later, via through holes formed by the insertion holes 50. Also, lands 67 are formed along peripheral edges of the insertion holes 51 (65b), and are electrically connected to lands 73 of the second-layer pattern 72 and lands 67 of the fourth-layer ground pattern 88, described later, via through holes formed by the insertion holes 51.

Denoted by 70 is a ground pattern formed on the first-layer ground pattern 64. The ground pattern 70 is soldered to those ones of the terminal portions 18 of the pin contacts 10 in the upper and lower stages which locate at both ends for grounding. Denoted by 65a are those ones of the insertion holes 50, 51 which locate in the ground pattern 70 and into which are inserted the grounding terminal portions 18 of the pin contacts 10 at both the ends. Soldering lands are formed by opening 86a bored in the first-layer resist 86 corresponding to the insertion holes 65a (and 65b). The ground pattern 70 is isolated from the lands 66, 67 by a no-pattern-formed portion 71 around these lands.

Further, the ground pattern 70 is connected to ground connecting pads 68 disposed between connecting pads 69, 69, . . . which are formed to lie on a row along a lower edge of the board. The ground connecting pads 68 are electrically connected to ground patterns 76, 83, 70 of the second-layer pattern 72, the third pattern 79 and the fourth-layer ground pattern 88, described later, by through holes 75. Also, the connecting pads 69 are electrically connected to connecting ends 73a of lands 73 of the second-layer pattern 72, described later, by through holes 74. Incidentally, the connecting springs 27, 27, . . . of the conversion connector 22 come into pressure contact with the ground connecting pads 68 and the connecting pads 69.

The first-layer resist 86 is superposed on a surface (one side) of the first-layer ground pattern 64. As shown in FIG. 9A, the first-layer resist 86 has the openings 86a where the lands 66, 67, the connecting pads 68, 69 and the insertion holes 65a, 65b are to be exposed.

Figure 9C:
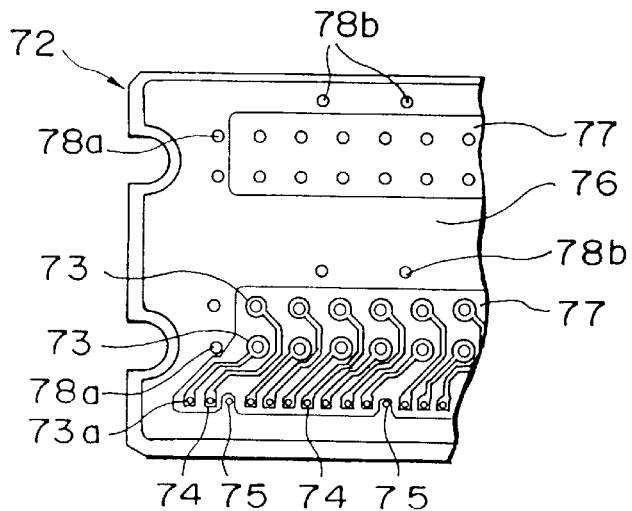

The second-layer pattern 72 is a pattern constituted by copper foils formed on its base B. As shown in FIG. 9C, lands 73 are formed around the respective insertion holes 51. The lands 73 are electrically connected to the lands 67 of the first-layer ground pattern 64 and the fourth-layer ground pattern 88 via the through holes formed by the insertion holes 51. Accordingly, by soldering the terminal portions 18 of the pin contacts 10 in the lower stage to the lands 67 of the first-layer ground pattern 64, the terminal portions 18 are electrically connected to the lands 73 of the second-layer pattern 72 via the lands 67 and the through holes formed by the insertion holes 51. The lands 73 are then connected by routing patterns to the connecting ends 73a which are connected to the connecting pads 69 of the first-layer ground pattern 64 by the through holes 74.

Denoted by 76 is a ground pattern formed on the second-layer pattern 72. As with the first-layer ground pattern 64, the ground pattern 76 is electrically connected via through holes to those ones of the terminal portions 18 of the pin contacts 10 in the upper and lower stages which locate at both ends for grounding. Denoted by 78a are those ones of the insertion holes 50, 51 into which are inserted the grounding terminal portions 18 of the pin contacts 10 at both the ends. The ground pattern 76 is isolated from the lands 73, the insertion holes 50, etc. by a no-pattern-formed portion 77 around the latter. Further, the ground pattern 76 is electrically connected to the ground connecting pads 68 of the first- and fourth-layer ground patterns 64, 88 by the through holes 75.

Figure 10A:
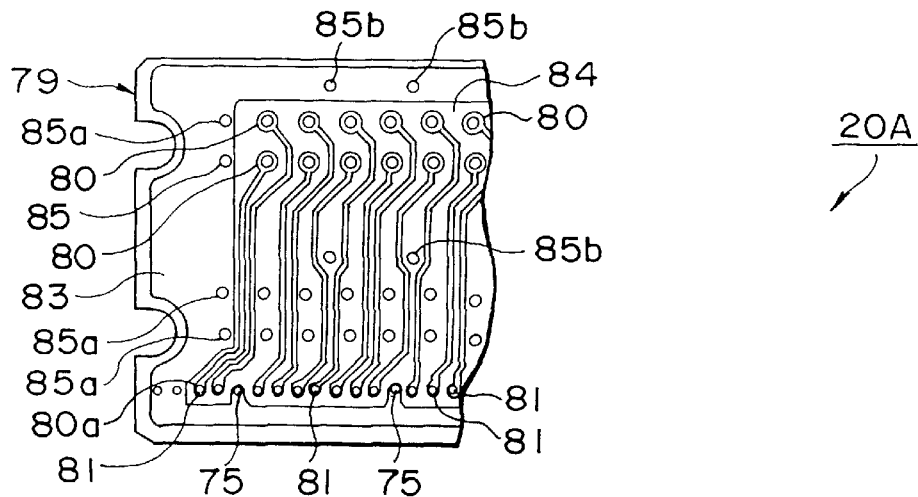
FIGS. 10A–C are a set of plan views of various patterns formed on the board of the connector.
Figure 10B:
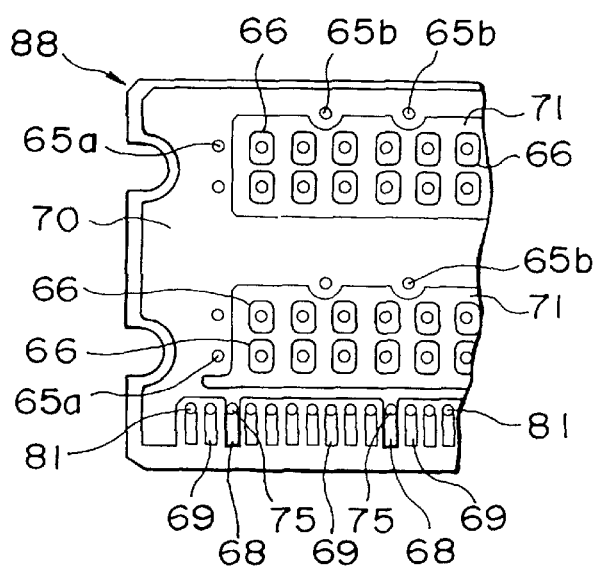
Figure 10C:
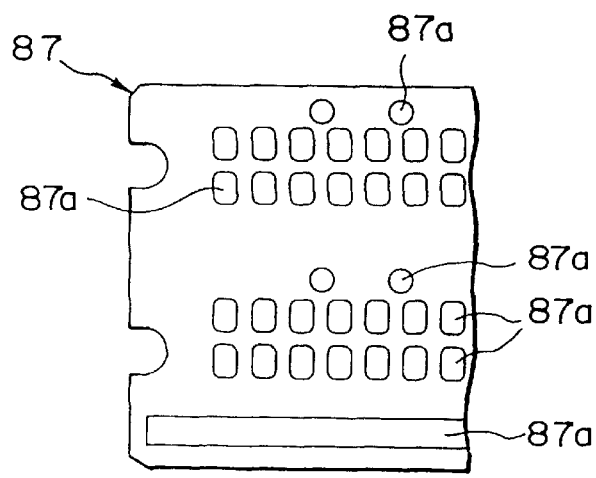

The third-layer pattern 79 is a pattern constituted by copper foils formed on its base B. As shown in FIG. 10A, lands 80 are formed around the respective insertion holes 50. The lands 80 are electrically connected to the lands 66 of the first-layer ground pattern 64 and the fourth-layer ground pattern 88 via the through holes formed by the insertion holes 50. Accordingly, by soldering the terminal portions 18 of the pin contacts 10 in the upper stage to the lands 66 of the first-layer ground pattern 64, the terminal portions 18 are electrically connected to the lands 80 of the third-layer pattern 79 via the lands 66 and the through holes formed by the insertion holes 50. The lands 80 are then connected by routing patterns to connecting ends 80a of the third-layer pattern 79 which are electrically connected to connecting pads 69 of the fourth-layer ground pattern 88 by through holes 81 as with the aforesaid connecting ends 80a. Denoted by 83 is a ground pattern isolated from the lands 80, etc. by a no-pattern-formed portion 84 around the latter. The ground pattern 83 is electrically connected to the ground connecting pads 68 of the first- and fourth-layer ground patterns 64, 88 by the through holes 75. Denoted by 85a are those ones of the insertion holes 50, 51 which are formed in the ground pattern 83 and into which are inserted the grounding terminal portions 18 of the pin contacts 10 at both the ends. Denoted by 85b are insertion holes corresponding to the insertion holes 53 into which are inserted the terminal portions 40 of the shroud 38. Incidentally, the through holes 81 are not electrically connected to the through holes 74.

Note that, in the third-layer pattern 79, no lands are formed around the insertion holes 51.

The fourth-layer resist 87 is superposed on a surface (one side) of the fourth-layer ground pattern 88 (on the rear side relative to the first-layer ground pattern 64). As shown in FIG. 10, the fourth-layer resist 87 has openings 87a where the lands 80, the connecting pads 68, 69 and the insertion holes 65a, 65b are to be exposed.

The multilayered board 20A is formed by superposing the above-mentioned layers. From the side of the fourth-layer ground pattern 88 of the board 20A, as shown in FIG. 4, the terminal portions 18 of the pin contacts 10 in the upper stage are inserted through the insertion holes 50, the terminal portions 18 of the pin contacts 10 in the lower stage are inserted through the insertion holes 51, and the terminal portions 40 of the shrouds 38 are inserted through the insertion holes 53, respectively, such that tips of those terminal portions are projected from the side of the first-layer ground pattern 64. After that, soldering is applied to the board 20A on the side of the first-layer ground pattern 64 for fixedly connecting the terminal portions 18 of the pin contacts 10 in the upper stage to the lands 66 of the first-layer ground pattern 64, the terminal portions 18 of the pin contacts 10 in the lower stage to the lands 67 thereof, and the grounding terminal portions 18 of the pin contacts 10 and the terminal portions 40 of the shrouds 38 to the lands of the ground pattern 70 in the first-layer ground pattern 64 around the insertion holes 65a, 65b by solders.

In the second embodiment, therefore, by fitting the lower edge of the board 20A to the fitting groove 23 of the conversion connector 22 as shown in FIG. 4, the terminal portions 18 of the pin contacts 10 in the lower stage are connected to the circuit pattern on the main printed board 21 via the lands 67 of the first-layer ground pattern 64, the through holes formed by the insertion holes 51, the lands 73 of the second-layer pattern 72, the through holes 74, the connecting pads 69 of the first-layer ground pattern 64, and the connecting springs 27 on the right side of the conversion connector 22.

Also, the terminal portions 18 of the pin contacts 10 in the upper stage are connected to the circuit pattern (not shown) on the main printed board 21 via the lands 66 of the first-layer ground pattern 64, the lands 80 of the third-layer pattern 79 which are electrically connected to the lands 66 by the through holes, the through holes 81, the connecting pads 69 of the fourth-layer ground pattern 88, and the connecting springs 27 on the left side of the conversion connector 22.

Further, the grounding terminal portions 18 of the pin contacts 10 at both the ends are electrically connected to the ground patterns 70 of the first-layer ground pattern 64 and the fourth-layer ground pattern 88 via the through holes formed by the insertion holes 65a, 78a, 85a.

While the second embodiment has been explained as inserting the terminal portions 18 of the pin contacts 10 through the insertion holes 50, 51 from the side of the fourth-layer ground pattern 88 of the board 20A, the terminal portions may be inserted from the side of the first-layer ground pattern 64.

The second embodiment thus constructed can also provide similar advantages as with the first embodiment.

A third embodiment of the present invention will be described below with reference to FIGS. 11 to 13.

Figure 11:
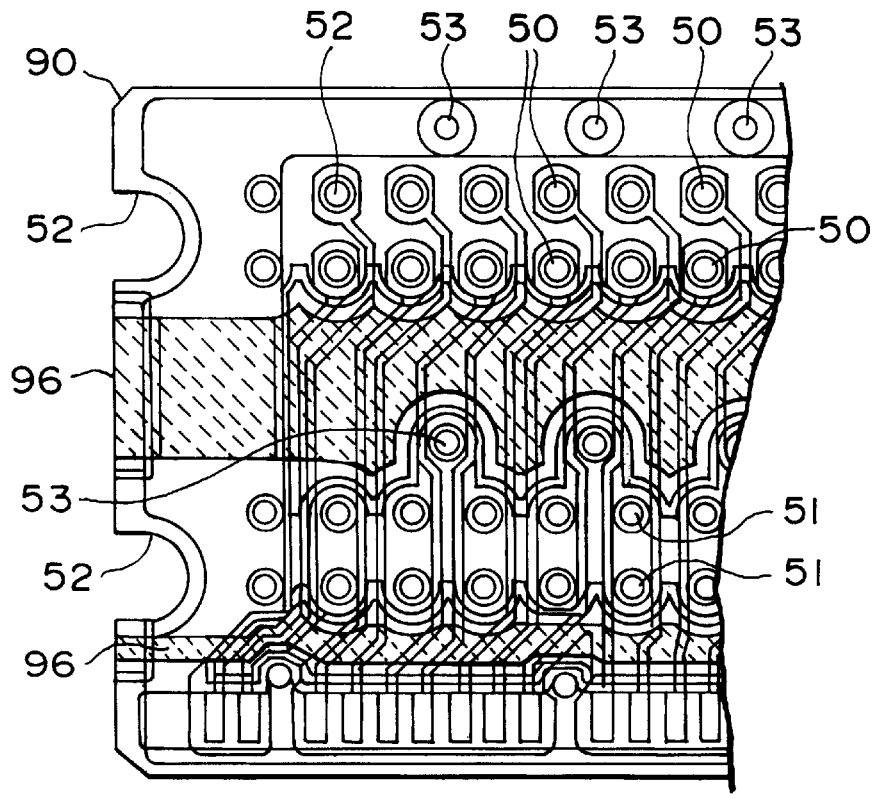
FIG. 11 is a plan view of a board of a PC card connector according to a third embodiment of the present invention.
Figure 12:
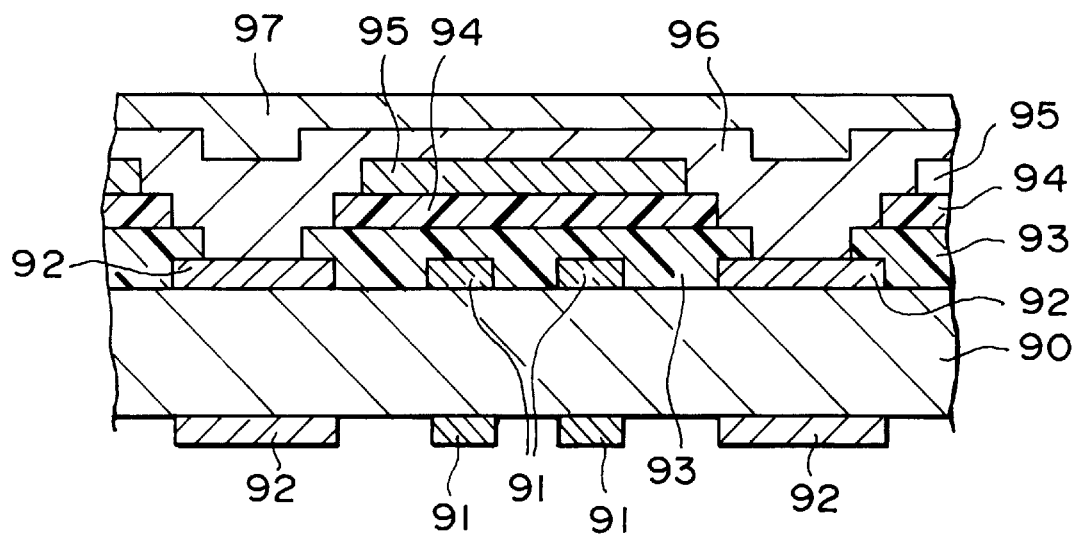
FIG. 12 is a vertical sectional view of the board of the connector.
Figure 13A:
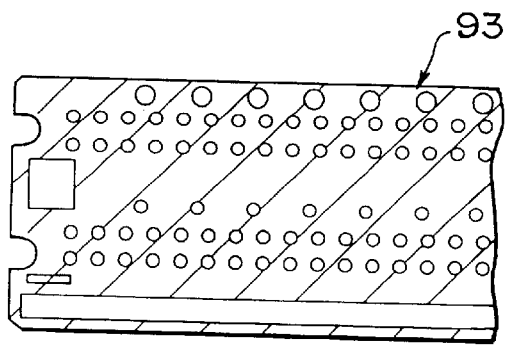
FIGS. 13A–D are a set of plan views of various patterns formed on the board of the connector.
Figure 13B:
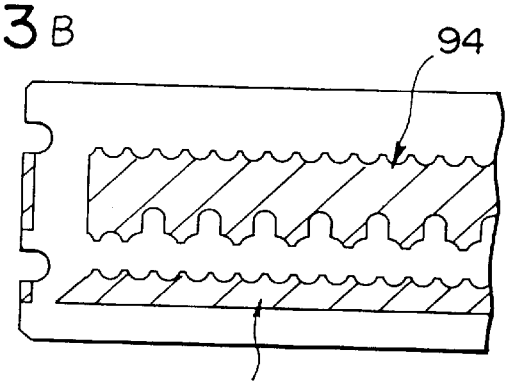
Figure 13C:
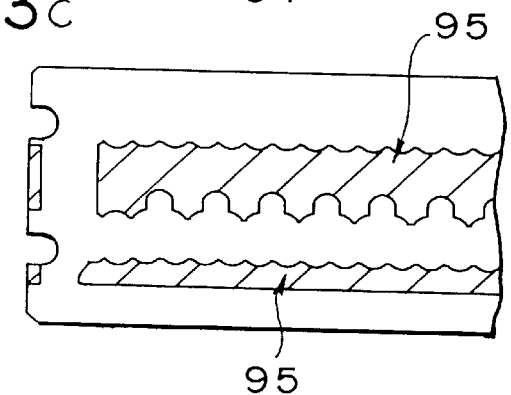
Figure 13D:
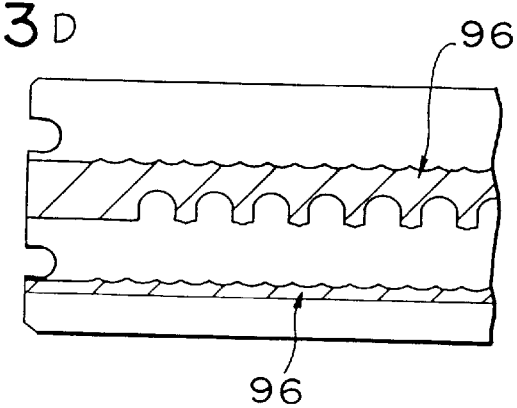
Figure 14:
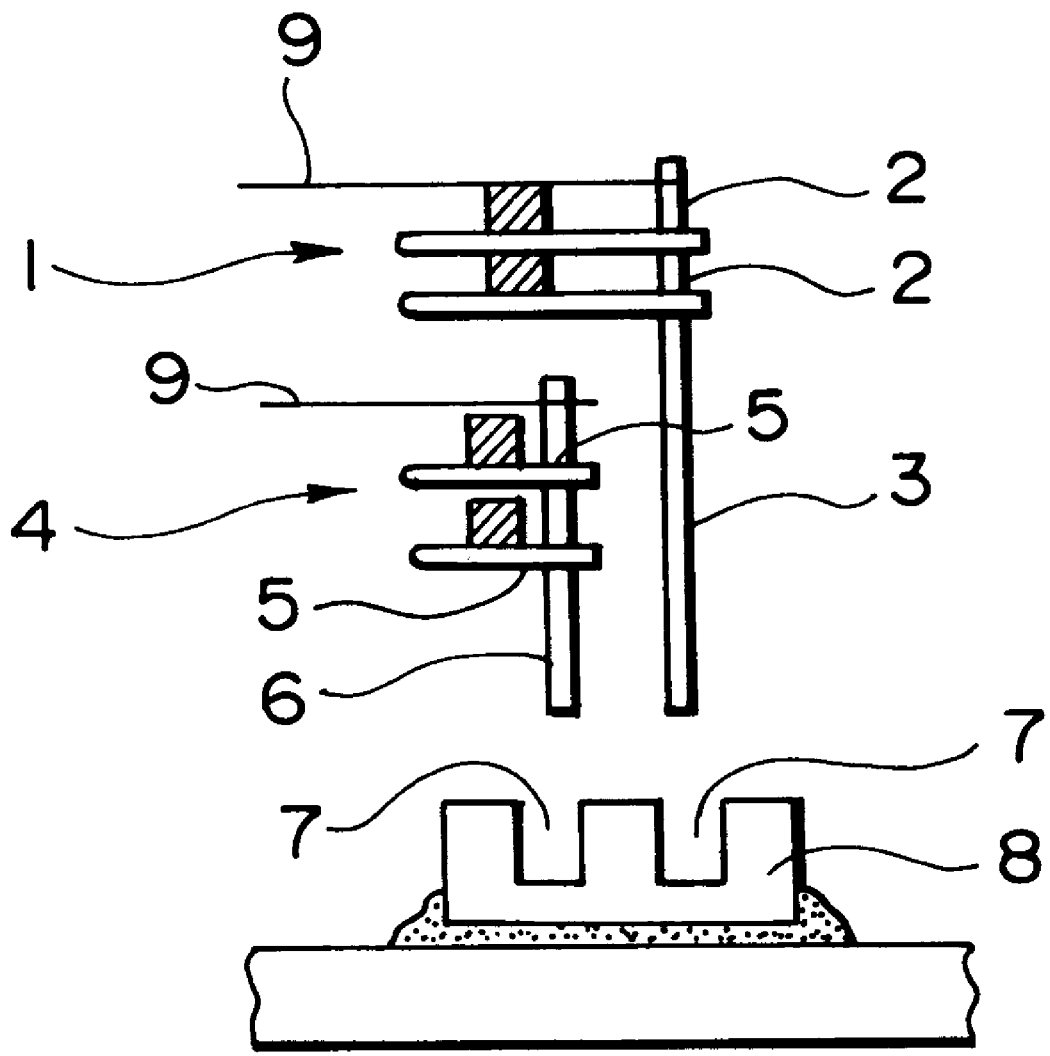
FIG. 14 is an explanatory view of a conventional PC card connector.

FIG. 11 is a plan view of a board of a PC card connector according to the third embodiment of the present invention, FIG. 12 is a vertical sectional view of the board of the connector, and FIGS. 13A–13D are a set of plan views of various patterns formed on the board of the connector.

In the third embodiment, the board is a printed wiring board of electromagnetic wave shielding type wherein the two (second and third) inner layers for grounding are eliminated, both sides of the board are interconnected by through holes, and ground patterns are formed by baking on first and fourth layers serving as signal patterns. Note that FIG. 11 shows a resist only on the side of the first layer (having the same pattern as the first-layer pattern 48 shown in FIG. 6), and a resist on the fourth layer is omitted.

In the drawings, denoted by 90 is a board body, 91 is a circuit (pattern) formed on each of both sides of the board body 90, and 92 is a ground (GND) circuit formed on each of both sides of the board body 90 in surrounding relation to the circuit 91. Stated otherwise, in this third embodiment, the fourth layer is formed on a rear surface of the first layer of the board in the first embodiment. Note that the same components as those in the first embodiment are denoted by the same numerals and will not be described below in detail.

Resist layers, etc. are laminated on both surfaces of the board body 90 with the circuits 91, 91 and the ground circuits 92, 92 formed thereon. Denoted by 93 is a first under resist (see hatched portion in FIG. 13A) which covers the circuits 91, 91 and all exposed surfaces of the board body 90 on each of both sides. The first under resists 93 also cover edge portions of the ground circuits 92. In other words, upper surfaces of the ground circuits 92 are not covered by the first under resists 93, but exposed.

Denoted by 94 is a second under resist (see hatched portion in FIG. 13B) laminated on each of the first under resists 93 in smaller size then the first under resist 93, and 95 is a third under resist (see hatched portion in FIG. 13C) laminated on the second under resist 94 in smaller size then the second under resist 94. Denoted by 96 is an electromagnetic wave shield (see hatched portion in FIG. 13D) laminated so as to entirely cover the upper surfaces of the first under resist 93, the second under resist 94, the third under resist 95 and the ground circuits 92, and 97 is a shield overcoat laminated on the electromagnetic wave shield 96.

In the third embodiment thus constructed, the ground circuits 92 are connected to the electromagnetic wave shield 96 and, though not shown, the ground circuits 92 on both sides are connected to each other by through holes. Accordingly, the second embodiment can also provide similar advantages as with the above embodiments.

Additionally, the third embodiment is also may be modified such that the inner layers provide signal lines and the surface layers provide ground lines.

According to the first aspect of the present invention, since only one board is used, the number of steps necessary for carrying out, e.g., soldering on the board in the assembly process can be cut down, the production cost can be reduced, and the time required for the assembly work can be shortened. Also, since the conversion connector is required to have a space for insertion of only one board, the connector itself and a unit receiving the connector are reduced in both size and weight. Further, since an inner layer of the board serves as a specific ground layer, a sufficient grounding effect is achieved.

According to the second aspect of the present invention, since two inner layers serve as ground layers, impedance can be kept small, a rise in potential can be suppressed, and conductivity efficiency can be improved.

According to the third aspect of the present invention, since an inner layer serves as a ground layer common to both surface layers, matching between both the surface layers can be established with low impedance, a rise in potential can be suppressed, and conductivity efficiency can be improved.

According to the fourth aspect of the present invention, since the layer of the board including a signal pattern formed thereon and locating on the side opposite to the soldered surface is formed such that lands are partly made small or eliminated to increase a width of each pattern line extending between the lands and a distance between the pattern lines, a transmission characteristic is improved.

According to the fifth aspect of the present invention, since the distance between lines of a signal pattern of the surface layer on each of both the surface sides is substantially equal to the distance between the surface layers and the inner layer, impedance becomes equal, a potential difference can be reduced, and conductivity efficiency can be improved.

What is claimed is:

1. A PC card connector comprising:
   a single board provided with a first and second pin housings arranged one above the other, each pin housing including a corresponding first and second set of connector pins;

said connector pins soldered to said board and adapted to be connected to a first PC card and a second PC card, such that said first and said second PC cards are capable of being arranged one above the other;

a shield member soldered to said board and arranged to cover a portion of each set of connector pins;

said first set of connector pins connected to a signal pattern arranged at a front surface of the board;

said second set of connector pins connected to a signal pattern arranged at a rear surface of the board;

said shield member connected to a ground layer formed at an inner layer of the board; and a conversion connector attached to said board;

said board being constructed as a multilayered board having a first and second outer layer and at least one inner layer, said outer layers each having a surface side and an inner side which faces said inner layer;

said signal pattern being formed on each of said surface sides of said first and second outer layer, said ground pattern being formed on said inner layer;

whereby said connector pins in said pin housing arranged at a lower stage are connected to the signal pattern on the surface side of one of said first and second outer layer, and said connector pins in said pin housing arranged at an upper stage are connected to the signal pattern on the surface side of the other of said first and second outer layer, and said outer layer located on the side opposite to a soldered surface of said board, to which said connector pins are soldered, is formed such that soldering lands around insertion holes, through which said connector pins in said pin housing arranged at the lower stage are inserted, are eliminated to increase a width of each pattern line extending between said insertion holes and to increase a distance between the pattern lines.

2. The PC card connector according to claim 1, wherein said board has a first and second outer layer and a first and second inner layer, said outer layers each having a surface side and an inner side, the inner side of said first outer layer facing said first inner layer, the inner side of said second outer layer facing said second inner layer;

each of said outer layers is capable of forming a signal pattern on said surface side; and each of said inner layers is capable of forming a ground pattern on a surface thereof which faces corresponding one of said outer layers.

3. The PC card connector according to claim 1, wherein said board has a first and second outer layer and an inner layer, said outer layers each having a surface side and an inner side which faces said inner layer, said inner layer capable of serving as a ground pattern common to the signal patterns of said outer layers.

4. The PC card connector according to claim 1, comprising:

a plurality of connector springs stored in the conversion connector, each of said springs having an end capable of being soldered to a main board;

a plurality of contact sections for signal patterns connected to corresponding connector springs; and a plurality of contact sections for ground patterns arranged at a lower end of each of said outer and inner layers, wherein said contact sections for ground patterns are spaced apart at a specific distance and are arranged between said contact sections for signal patterns.

5. A PC card connector comprising:

a single board provided with first and second pin housings arranged one above the other, each pin housing including a corresponding first and second set of connector pins;

said connector pins soldered to said board and adapted to be connected to a first PC card and a second PC card, such that said first and said second PC cards are capable of being arranged one above the other;

a shield member soldered to said board and arranged to cover a portion of each set of connector pins;

said first set of connector pins connected to a signal pattern arranged at a front surface of said board;

said second set of connector pins connected to a signal pattern arranged at a rear surface of said board;

said shield member connected to a ground layer formed at an inner layer of said board; and a conversion connector attached to said board;

said board being constructed as a multilayered board having a first and second outer layer and at least one inner layer, said outer layers each having a surface side and an inner side which faces said inner layer;

said signal pattern being formed on each of the surface sides of said first and second outer layer, said ground pattern being formed on said inner layer;

whereby said connector pins in said pin housing arranged at a lower stage are connected to the signal pattern on the surface side of one of said first and second outer layer, and said connector pins in said pin housing arranged at an upper stage are connected to the signal pattern on the surface side of the other of said first and second outer layer, and the distance between lines of the signal pattern on the surface side of said first outer layer is substantially equal to a thickness of said first outer layer and the distance between lines of the signal pattern on the surface side of said second outer layer is substantially equal to a thickness of said second outer layer.

6. The PC card connector according to claim 5, wherein said board has a first and second outer layer and a first and second inner layer, said outer layers each having a surface side and an inner side, the inner side of said first outer layer facing said first inner layer, the inner side of said second outer layer facing said second inner layer;

each of said outer layers is capable of forming a signal pattern on said surface side; and each of said inner layers is capable of forming a ground pattern on a surface thereof which faces corresponding one of said outer layers.

7. The PC card connector according to claim 5, wherein said board has a first and second outer layer and an inner layer, said outer layers each having a surface side and an inner side which faces said inner layer, said inner layer capable of serving as a ground pattern common to the signal patterns of said outer layers.

8. The PC card connector according to claim 5, comprising:

a plurality of connector springs stored in the conversion connector, each of said springs having an end capable of being soldered to a main board;

a plurality of contact sections for signal patterns connected to corresponding connector springs; and a plurality of contact sections for ground patterns arranged at a lower end of each of said outer and inner layers, wherein said contact sections for ground patterns are spaced apart at a specified distance and are arranged between said contact sections for signal patterns.

9. A PC card connector comprising:

a single board provided with first and second pin housings arranged one above the other, each pin housing including a corresponding first and second set of connector pins;

said connector pins soldered to said board and adapted to be connected to a first PC card and a second PC card, such that said first and said second PC cards are capable of being arranged one above the other;

a shield member soldered to said board and arranged to cover a portion of each set of connector pins; and a conversion connector attached to said board;

said board being constructed as a multilayered board having a first and second outer layer and at least one inner layer, said outer layers each having a surface side and an inner side which faces said inner layer;

said inner layer having signal patterns formed thereon, said first and second outer layer having ground patterns formed on the surface sides thereof;

whereby said connector pins in said pin housing arranged at a lower stage are connected to the signal pattern on one surface of said inner layer which faces the inner side of one of said first and second outer layer, said connector pins in said pin housing arranged at an upper stage are connected to the signal pattern on the other surface of said inner layer which faces the inner side of the other of said first and second outer layer, and said shield member is connected to the ground patterns formed on the surface sides of said first and second outer layer, and the distance between lines of the signal patterns formed on both the surfaces of said at least one inner layer is substantially equal to a thickness of said first and second outer layer facing said inner layer.

10. The PC card connector according to claim 9, wherein said board has a first and second outer layer and a first and second inner layer, said outer layers each having a surface side and an inner side, the inner side of said first outer layer facing said first inner layer, the inner side of said second outer layer facing said second inner layer;

each of said outer layers is capable of forming a signal pattern on said surface side; and each of said inner layers is capable of forming a ground pattern on a surface thereof which faces corresponding one of said outer layers.

11. The PC card connector according to claim 9, comprising:

a plurality of connector springs stored in the conversion connector, each of said springs having an end capable of being soldered to a main board;

a plurality of contact sections for signal patterns connected to corresponding connector springs; and a plurality of contact sections for ground patterns arranged at a lower end of each of said outer and inner layers, wherein said contact sections for ground patterns are spaced apart at a specified distance and are arranged between said contact sections for signal patterns.

* * * * *

UNITED STATES PATENT AND TRADEMARK OFFICE
CERTIFICATE OF CORRECTION

PATENT NO. : 6,062,904
DATED : May 16, 2000
INVENTOR(S) : Oguchi et al.

Page 1 of 1

It is certified that error appears in the above-identified patent and that said Letters Patent is hereby corrected as shown below:

On Title page, after item [76]
Insert -- [73] Assignee: Alps Electric Co., Ltd., Tokyo, Japan --.

Signed and Sealed this

Twelfth Day of June, 2001

*Attest:*

*Attesting Officer*

NICHOLAS P. GODICI
*Acting Director of the United States Patent and Trademark Office*